(12) United States Patent
Anbai et al.

(10) Patent No.: US 7,829,475 B2
(45) Date of Patent: Nov. 9, 2010

(54) BAKING METHOD OF QUARTZ PRODUCTS, COMPUTER PROGRAM AND STORAGE MEDIUM

(75) Inventors: Katsuhiko Anbai, Oshu (JP); Masayuki Oikawa, Oshu (JP); Tetsuya Shibata, Nirasaki (JP); Yuichi Tani, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 455 days.

(21) Appl. No.: 11/812,611

(22) Filed: Jun. 20, 2007

(65) Prior Publication Data
US 2007/0298621 A1 Dec. 27, 2007

(30) Foreign Application Priority Data
Jun. 23, 2006 (JP) .............................. 2006-174661

(51) Int. Cl.
*H01L 21/00* (2006.01)
(52) U.S. Cl. ........................ 438/795; 438/689; 438/905; 438/935; 257/E21.219; 257/E21.224
(58) Field of Classification Search ................. 438/716, 438/935; 257/E21.222, E21.224, E21.227, 257/E21.229, E21.31, E21.333
See application file for complete search history.

(56) References Cited

U.S. PATENT DOCUMENTS

| 7,082,789 B2 | 8/2006 | Ezaki et al. | |
| 2002/0020433 A1* | 2/2002 | Suemura et al. | 134/2 |
| 2004/0237589 A1* | 12/2004 | Sato | 65/31 |

FOREIGN PATENT DOCUMENTS

| JP | 2002-313787 | 10/2002 |
| JP | 2003-171128 | 6/2003 |
| JP | 2003-313787 | 11/2003 |

OTHER PUBLICATIONS

Copending Application, filed concurrently (Jun. 20, 2007), "Quartz Products and Heat Treatment Apparatus".
Office Action issued on May 7, 2008 for Japanese Application No. 2006-174661.

* cited by examiner

*Primary Examiner*—Scott B Geyer
*Assistant Examiner*—Cheung Lee
(74) *Attorney, Agent, or Firm*—Smith, Gambrell & Russell, LLP (57) ABSTRACT

The present invention relates to control of copper contamination to semiconductor substrates upon operation of a heat treatment apparatus which is a semiconductor manufacturing apparatus and which is constructed with quartz products having been contaminated with copper when machined. The quartz product is placed in a heating atmosphere on the stage where it is not still used for a heat treatment for semiconductor substrates. Baking gases including a hydrogen chloride gas and a gas for enhancing activity of the hydrogen chloride gas, for example, an oxygen gas, are then supplied to the quartz product. Consequently, the copper concentration in the region from the surface to the 30 μm depth of the quartz product can be controlled below 20 ppb, preferably below 3 ppb. The baking process may be carried out before or after assembling the quartz product into the heat treatment apparatus.

11 Claims, 6 Drawing Sheets

BAKING METHOD OF QUARTZ PRODUCTS, COMPUTER PROGRAM AND STORAGE MEDIUM

BACKGROUND OF THE INVENTION

1. Field of the Invention

The present invention relates to a technique for removing metals contained in a quartz product by baking the quartz product which is a component of a heat treatment apparatus for heating semiconductor substrates.

2. Background Art

As one example of the heat treatment apparatus used in a semiconductor manufacturing process, there is known a vertical-type heat treatment apparatus which is a batch-type heat treatment apparatus. This vertical-type heat treatment apparatus comprises a heating furnace including a vertical-type reaction vessel which opens downwardly and a heater provided to surround the outside of the reaction vessel. Multiple sheets of semiconductor wafers (hereinafter referred to as wafers) are held in a shelf-like state by a wafer holding tool called wafer boat and carried into the reaction vessel from below, so as to perform a film forming process or the like, by oxidation, diffusion process or CVD, in the reaction vessel.

The reaction vessel, the wafer boat and a thermal insulation unit (or heat insulation unit) which constitute the heat treatment apparatus are usually formed from quartz. While such quartz products are machined through various steps starting from a quartz ingot, metallic contamination due to copper or the similar metal tends to occur because of contact with machining tools or effect from the working atmosphere. In particular, for the wafer boat, supporting portions for supporting wafers are composed of grooves or nails and require fine machining works for their formation, as such increasing the possibility of copper contamination. Quartz products are washed with hydrofluoric acid by a quartz product maker in order to remove copper present in the surface portion. However, the copper ions eluted into the hydrofluoric acid may tend to be coupled again to uncoupled sites of silicon atoms, resulting in leaving a trace amount of copper in the surface portion of the quartz products.

The quartz products are carried in a semiconductor manufacturing apparatus maker, assembled together, and shipped as a vertical-type heat treatment apparatus to a user. In this case, if the surface portion of each quartz product is contaminated with even a trace amount of copper, when the user starts the operation of the apparatus to carry out a heat treatment of wafers, the copper is heated up so as to make the molecular movement vigorous, as such a part of the copper is scattered into the heating atmosphere, then attaches to wafers and causes contamination of the wafers. In particular, for the wafer boat, since each wafer is placed thereon so as to directly contact with it, metals contained in the surface portion of the wafer boat are likely to be transferred into the wafer. In recent years, attempts to make semiconductor devices thinner and finer have been advanced. Accordingly, even though the wafer is contaminated by a trace amount of copper, electric characteristics of semiconductor devices may be badly affected, thus lowering the yield.

Patent Document 1 describes a baking process for quartz products at 1000° C. for 2 hours in the presence of hydrogen chloride gas and oxygen gas after assembling quartz products into a heat treatment apparatus and before effecting oxidation. The Patent Document 1 also discloses to conduct the baking before the incorporation of quartz products into a heat treatment apparatus, and describes that the number of copper atoms present in the surface portion of the quartz products can be reduced by carrying out such baking.

However, through various experiments, the inventor has found that, in some cases, the copper is not only attached to the surfaces of the quartz products, but, in fact, penetrates into the interior of each quartz product, and the copper concentration of the interior is higher than that of the surface portion in terms of the copper concentration profile in the depth direction. Therefore, the assessment for the copper a contamination of quartz products based only on the number of copper atoms in the surface portion of the quartz products can not successfully meet the prevention of wafer contamination.

Patent Document 1: TOKUKAI No. 2002-313787 (claim 1, Paragraphs [0017] to [0027])

SUMMARY OF THE INVENTION

The present invention was made under such circumstances as described above, and therefore it is an object of this invention to provide a baking method of a quartz product used as a part of a heat treatment apparatus which serves as a semiconductor manufacturing apparatus, wherein the quartz product can suppress copper contamination of semiconductor substrates.

The present invention is a baking method of a quartz product, which is placed in a reaction vessel for containing semiconductor substrates and providing a heat treatment thereto, and at least a portion of which is located in a heating atmosphere in the reaction vessel, the baking method comprising the steps of: placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 30 μm depth of the quartz product can be controlled below 20 ppb.

The present invention is the baking method described above, wherein the copper concentration in the region from the surface to the 30 μm depth is below 3 ppb.

The present invention is the baking method described above, wherein the quartz product includes a portion which is directly contacted with semiconductor substrates, and wherein in the site which is directly contacted with semiconductor substrates, the copper concentration in the region from the surface to the 1 μm depth is below 10 ppb.

The present invention is a baking method of a quartz product, which is placed in a reaction vessel for containing semiconductor substrates and providing a heat treatment thereto, and at least a portion of which is located in a heating atmosphere in the reaction vessel, the baking method comprising the steps of: placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 10 μm depth of the quartz product can be controlled below 10 ppb.

The present invention is the baking method described above, wherein the copper concentration in the region from the surface to the 10 μm depth is below 3 ppb.

The present invention is the baking method described above, wherein the quartz product is incorporated as a part of the heat treatment apparatus by providing the quartz product in the reaction vessel.

The present invention is the baking method described above, wherein the reaction vessel is heated at the temperature within the range of from 800 to 1000° C.

The present invention is a computer program for making a computer implement a baking method of a quartz product, which is placed in a reaction vessel for containing semiconductor substrates and providing a heat treatment thereto, and at least a portion of which is located in a heating atmosphere in the reaction vessel, the baking method comprising the steps of:

placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 30 μm depth of the quartz product can be controlled below 20 ppb.

The present invention is a computer program for making a computer implement a baking method of a quartz product, which is placed in a reaction vessel for containing semiconductor substrates and providing a heat treatment thereto, and at least a portion of which is located in a heating atmosphere in the reaction vessel, the baking method comprising the steps of:

placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 10 μm depth of the quartz product can be controlled below 10 ppb.

The present invention is a storage medium for storing a computer program for making a computer implement a baking method of a quartz product, which is placed in a reaction vessel for containing semiconductor substrates and providing a heat treatment thereto, and at least a portion of which is located in a heating atmosphere in the reaction vessel, the baking method comprising the steps of:

placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 30 μm depth of the quartz product can be controlled below 20 ppb.

The present invention is a storage medium for storing a computer program for making a computer implement a baking method of a quartz product, which is placed in a reaction vessel for containing semiconductor substrates and providing a heat treatment thereto, and at least a portion of which is located in a heating atmosphere in the reaction vessel, the baking method comprising the steps of:

placing the quartz product before subjected to the heat treatment, in the reaction vessel; and supplying baking gases, including a hydrogen chloride gas and a gas for enhancing reactivity of the hydrogen chloride gas, into the reaction vessel, while heating the reaction vessel, for removing copper as a contaminant incorporated during the manufacturing process of the quartz product, whereby the copper concentration in the region from the surface to the 10 μm depth of the quartz product can be controlled below 10 ppb.

According to the present invention, it can be found that, in the quartz product which is a part of the heat treatment apparatus, the copper contamination, which is generated on the manufacturing stage, is not only present at the surface of the quartz but also penetrates into the interior, and the profile of the copper concentration in the depth direction can be improved by baking the quartz product. Since the quartz product which exhibits a significantly low degree of copper contamination can be provided due to the improvement of the copper concentration profile, the copper contamination to semiconductor substrates to be heated by the heat treatment apparatus which is composed of such a quartz product can be surely reduced, thereby suppressing degradation of the yield.

DETAILED DESCRIPTION OF THE INVENTION

In order to implement the baking method of the quartz product of this invention, there can be mentioned a method of baking the quartz product before it is assembled into a heat treatment apparatus, or a method of baking the quartz product, after it is assembled into the heat treatment apparatus, by utilizing functions of the heat treatment apparatus (functions of gas supply, heating and the like).

Figure 1:
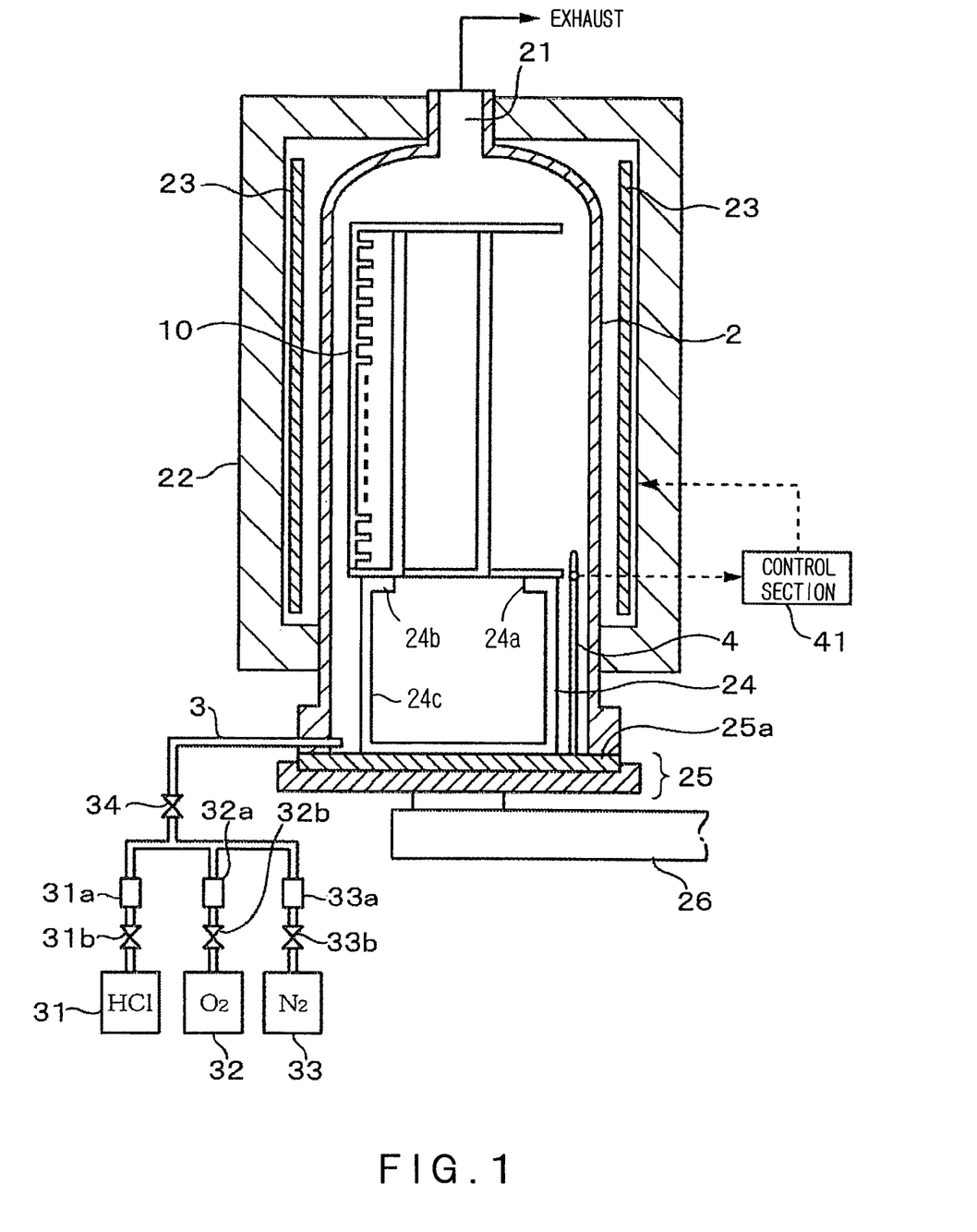
FIG. 1 is a cross section showing a baking apparatus for obtaining quartz products according to the present invention.

FIG. 1 is a baking apparatus for obtaining quartz products according to the present invention. In the drawing, reference numeral 2 designates a cylindrical reaction vessel formed from a non-metallic material, for example, quartz, which is opened downwardly and to which an exhaust port 21 is provided. A cylindrical housing 22 is provided around the reaction vessel 2. In addition, a heater 23, which is a heating means, is provided to extend in the vertical direction inside the housing 22. The heater 23 is, for example, a carbon wire heater formed by braiding multiple bundles of high purity carbon fibers.

On the lower side of the reaction vessel 2, a cover 25, which is an opening and closing portion, is provided. The cover 25 is raised and lowered by boat elevator 26, which is a part of a lifting mechanism, so as to open and close the reaction vessel 2. The cover 25 includes a quartz plate 25*a* located on its top face side, and a jig 24, which is adapted to hold quartz products, i.e., objects to be baked, is in turn mounted onto the quartz plate 25*a*. The jig 24 includes, for example, a ring body 24*b*, having an opening 24*a*, which will be described below, at its central portion, for allowing a gas used for baking to pass therethrough, and includes, for example, four legs 24*c*, for supporting the ring body 24*b* from below. On the jig 24, a wafer boat 10 is placed, which is a quartz product to be baked, and serves as a wafer holding tool.

Figure 2:
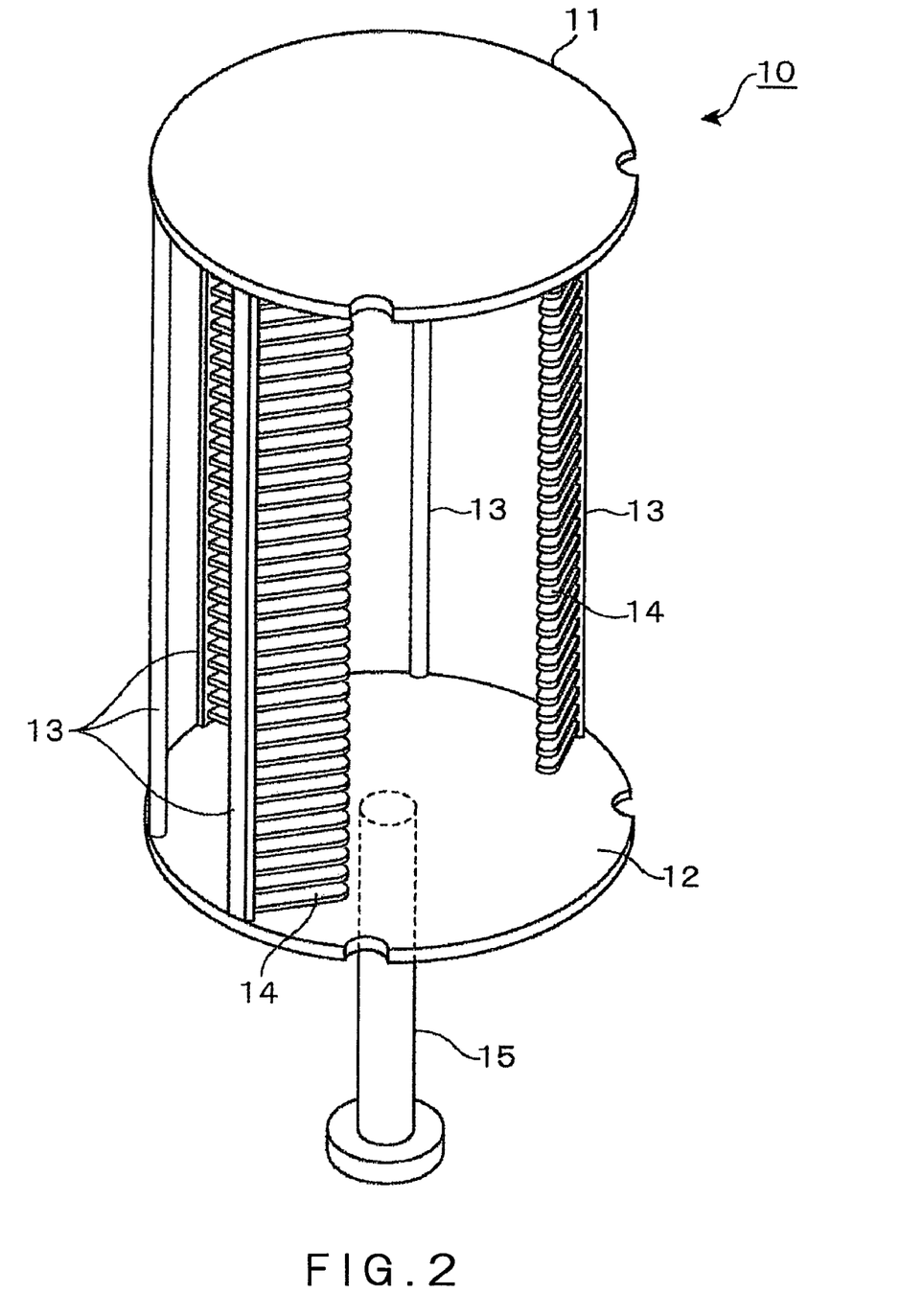
FIG. 2 is a perspective view showing a wafer boat which is a quartz product used as a part of a vertical-type heat treatment apparatus.

The wafer boat 10 is a part of a vertical heat treatment apparatus for heating semiconductor wafers, and includes a top plate 11 and a bottom plate 12 which are opposed to each other, and five supporting rods 13 which are provided between the top plate 11 and the bottom plate 12 to connect the top plate 11 with the bottom plate 12, and are positioned along the circumferential direction. Horizontal nail portions 14 for holding the periphery of each wafer are arranged in the vertical direction in each of the three of the five supporting rods 13. From the center of the bottom face of the bottom plate 12, a rotation shaft 15 extends downwardly. The rotation shaft 15 is supported by the jig 24 while being inserted in the opening 24*a* of the jig 24. The wafer boat 10 is made by grinding, cleaning, finishing, heating and cleaning, to the quartz materials, in this order. Assuming that a group of these steps is one cycle, the quartz products are manufactured by repeating this cycle many times.

On a side face on the bottom side of the reaction vessel 2, one end of a gas supply pipe 3, which is a gas supply means for supplying baking gases including a hydrogen chloride gas and a gas for enhancing reactivity of the hydrogen chloride gas, for example, an oxygen gas, is provided to project, for example, laterally toward the interior of the reaction vessel 2. It should be noted that the supply pipe 3 is not limited to such a configuration in which it is provided in one point, but may be arranged in plural numbers, for example, along the circumferential direction, of the reaction vessel 2.

The other end of the gas supply pipe 3 is branched off into three pipe lines via a valve 34, which are connected to a hydrogen chloride supply source 31, an oxygen supply source 32, and a nitrogen supply source 33, respectively. In the course of each pipe line, a mass flow controller 31*a* (32*a*, 33*a*) and a valve 31*b* (32*b*, 33*b*), for adjusting the flow rate, are provided, respectively. Reference numeral 34 designates a valve for supplying the baking gas into the reaction vessel 2.

In the reaction vessel 2, a temperature detecting portion, for example, a thermo-couple 4, which is supported by the cover 25, is provided extending upwardly, and the heat treatment due to the heater 23 is adjusted by a control section 41 in which a baking program is stored such that a value obtained by the temperature detection due to the thermo-couple 4 can be controlled at a predetermined temperature.

Next, the process for baking the wafer boat 10 under the atmospheric pressure by using the aforementioned baking apparatus will be described. First, while the cover 25 is located in its lowered position, the wafer boat 10 is placed on the jig 24, and the wafer boat 10 is then carried in the reaction vessel 2 by raising the cover 25, and thereafter the lower side opening of the reaction vessel 2 is closed to make the reaction vessel 2 airtight. Subsequently, the valve 33*b* is opened to supply nitrogen into the reaction vessel 2 at a predetermined flow rate, thereby performing nitrogen purge in the reaction vessel 2.

Next, while the nitrogen purge is continued, the temperature in the reaction vessel 2 is elevated by controlling the output of the heater 23. After the temperature reaches a preset baking temperature, the valves 31*b*, 32*b* are opened to supply the baking gases, i.e., in this example, the hydrogen chloride gas and the oxygen gas, into the reaction vessel 2, respectively. As a result, the copper attached to the surface of the wafer boat 10 and the copper penetrating into the interior, to some extent, from the surface react with the hydrogen chloride, resulting in a chloride. Thereafter, the chloride falls off from the quartz surface and is then discharged to the outside, via an exhaust passage (not shown), from the exhaust port 21, together with the baking gas. In this example, while oxygen gas is used as the gas for enhancing reactivity of the baking gas, such a gas is not limited to oxygen gas, but hydrogen gas or steam may also be used.

In the present invention, the baking process should be performed by determining the baking conditions, in advance, such that the copper concentration in the region form the surface to the 30 μm depth of the quartz product is reduced to 20 ppb or less, more preferably 3 ppb or less. To this end, as can be seen from an example described below, for example, the processing temperature is set at 950° C., the flow rate of the hydrogen chloride gas is set at 1slm (1 litter per minute), the flow rate of the oxygen gas is set at 10 slm, and the baking time is set at 3 hours. In this example, the volume of the reaction vessel 2 is approximately the same as a quartz tube for processing 75 sheets, as a maximum, of 12-inch wafers (corresponding to a reaction vessel of a vertical type heat treatment apparatus used as a semiconductor manufacturing apparatus).

After the predetermined time described above has passed, the supply of the hydrogen chloride gas is stopped by closing the valve 31*b* and oxygen purge is carried out, for example, for 30 minutes, by supplying the oxygen gas into the reaction vessel 2. While the oxygen purge may be carried out as needed, it is performed after the supply of the hydrogen chloride gas. Namely, this procedure can suppress generation of impurities which would be formed by coupling of chloric acid that would be produced by oxidation of the hydrogen chloride, to uncoupled parts of the quartz surface.

Thereafter, the supply of the oxygen gas is stopped, and the temperature in the reaction vessel is naturally cooled to a predetermined temperature, for example, an ordinary temperature to 100° C., while nitrogen purge is carried out supplying nitrogen gas into the reaction vessel 2. Subsequently, the cover 25 is lowered to carry the wafer boat 10 out of the reaction vessel 2, and the wafer boat 10 is taken out from the jig 24. In this way, the baking process is ended. In this case, the wafer boat 10 is incorporated into the vertical-type heat treatment apparatus for heating semiconductor wafers which are semiconductor substrates. The operation of the baking apparatus as described above is executed in accordance with a computer program which is stored in a memory of a computer which serves as a control section (not shown), wherein a group of steps in the program is provided to execute the aforementioned operation. The program is installed in the memory of the computer via a storage medium. As the storage medium, a CD ROM, a flexible disk, an MD, a hard disk, a flash memory, a memory card and an optical magnetic disk can be mentioned.

For example, as will be apparently seen from an example described below, by baking the quartz product under the conditions as previously described, the copper concentration in the region from the surface to the 10 μm depth of the quartz product can be reduced below 3 ppb, and the copper concentration even up to the 30 μm depth can also be lowered to 3 ppb, exhibiting purity which is substantially the same as that of the raw, i.e., uncontaminated material.

Furthermore, when the wafer boat is carried out from the reaction vessel, another quartz product, i.e., a quartz product, which is attached to the vertical wafer heat treatment apparatus and at least a part of which is positioned in the heating atmosphere, is placed on the jig 24 so as to be subject to the baking for the quartz product by executing the steps as described above. The quartz product other than the wafer boat can include a heat insulation member constituting a thermal insulation unit which will be described in the next example, a quartz tube which is the reaction vessel, a rod-shaped temperature sensor formed by inserting a thermo-couple into an elongated quartz tube, or a quartz plate constituting the top face of the cover. It should be noted that the baking is not limited to the process to bake each quartz product at a time, it may include processes for simultaneously baking the respective quartz products placed on the jig together. Of course, in such a case, a jig on which a plurality of quartz products can be placed is necessary.

According to the embodiment described above, the baking process as previously described is provided to a quartz product which is a component for constituting the vertical-type heat treatment apparatus, whereby the copper concentration in the region from the surface to the 30 μm depth of the quartz product can be reduced below 20 ppb, and it can be further reduced below 3 ppb by selecting more appropriate baking conditions. Namely, the copper concentration can be reduced below 20 ppb (or even below 3 ppb) in any portion from the surface to the 30 μm depth of the quartz product. Accordingly, in the case of heating wafers by using the vertical-type heat treatment apparatus which comprises such quartz products, contamination of the wafers due to copper can be mitigated, thus suppressing degradation of the yield. In particular, with the reduction of the copper concentration, in the region from the surface to the 30 μm depth, below 3 ppb, almost all of copper incorporated into the quartz product on its manufacturing stage can be removed, thus exhibiting purity approximately the same as that of the raw, i.e., uncontaminated material of the quartz product. Therefore, the possibility of copper contamination to wafers, which is attributed to the semiconductor manufacturing apparatus (for example, the vertical-type heat treatment apparatus), can be eliminated.

With selection of proper baking conditions, the copper concentration in the region from the surface to the 10 μm depth of the quartz product can be reduced below 10 ppb, and more preferably below 3 ppb. Accordingly, in such a case, the copper contamination to wafers can be reduced, thus suppressing the degradation of the yield.

In the case of processing wafers by using a non-reducing gas in the vertical-type heat treatment apparatus, the detachment amount of copper is less than in the case of processing wafers by using a reducing gas. Therefore, if the copper concentration is reduced below 3 ppb up to the 10 μm depth, the copper contamination to wafers can be adequately prevented. As such a process, oxidation and annealing at a temperature lower than 850° C. can be counted.

On the other hand, in the case of processing wafers by using a reducing gas in the vertical-type heat treatment apparatus, the detachment amount of copper is increased as compared with the above non-reducing gas case. Therefore, it is preferred that the copper concentration up to the 30 μm depth is reduced to the targeted value. As such a process, high temperature annealing, for example, annealing at a temperature higher than 900° C., can be counted. Accordingly, when reducing the copper concentration below 3 ppb up to the 30 μm depth, the copper contamination can be securely prevented and an excellent quartz product can be obtained, irrespectively of using either of a reducing gas or non-reducing gas as the processing gas used upon heating wafers.

In the case where the heat treatment apparatus to be assembled with the quartz products is one for performing a CVD process, it is necessary that the copper concentration in the region from the surface to the 10 μm depth is reduced below 10 ppb. When performing such a CVD process, the process time is approximately 5 hours, as a maximum, and the process temperature is about 700° C. at the most. Therefore, considering the safety margin, as the distance that the copper atoms are diffused (diffusion distance) at 1000° C. for 5 hour, 10 μm or less value can be obtained (see FIG. 6 described below). Accordingly, when the copper concentration in the region from the surface to the 10 μm depth can be controlled below 10 ppb, the amount of copper scattered into the processing atmosphere can be reduced to a significantly lower value, thus providing quite effective conditions for suppressing the copper contamination to wafers.

As described above, according to the present invention, it has been found that copper is not only attached to the surfaces of the quartz products but also penetrates into the interior of each quartz product upon the manufacturing stage of the quartz products. A quartz product, whose copper concentration is controlled also in the depth direction, can be obtained on the basis of the relationship between the copper concentration profile in the depth direction and the baking conditions, while the copper concentration profile in the depth direction has not been noted for the quartz products in the above Patent Document 1.

Since copper present in the region from the surface to the 1 μm depth of a quartz product (copper present in the outer most layer within the range of from 0 to 1 μm depth) is directly transferred to wafers, for example, for the wafer boat 10 which is a quartz product to be in direct contact with wafers, it is preferred that the copper concentration in the region from the surface to the 1 μm depth is controlled below 10 ppb. By doing so, the number of copper atoms per square centimeter in the portion of each wafer, which contacts with the wafer boat, can be reduced below $2 \times 10^{10}$, having no impact on the yield.

As the heat treatment apparatus made by assembling the quartz products, an oxidation furnace, a diffusion furnace for diffusing impurities into a semiconductor layer(s), and a CVD furnace can be counted.

Figure 3:
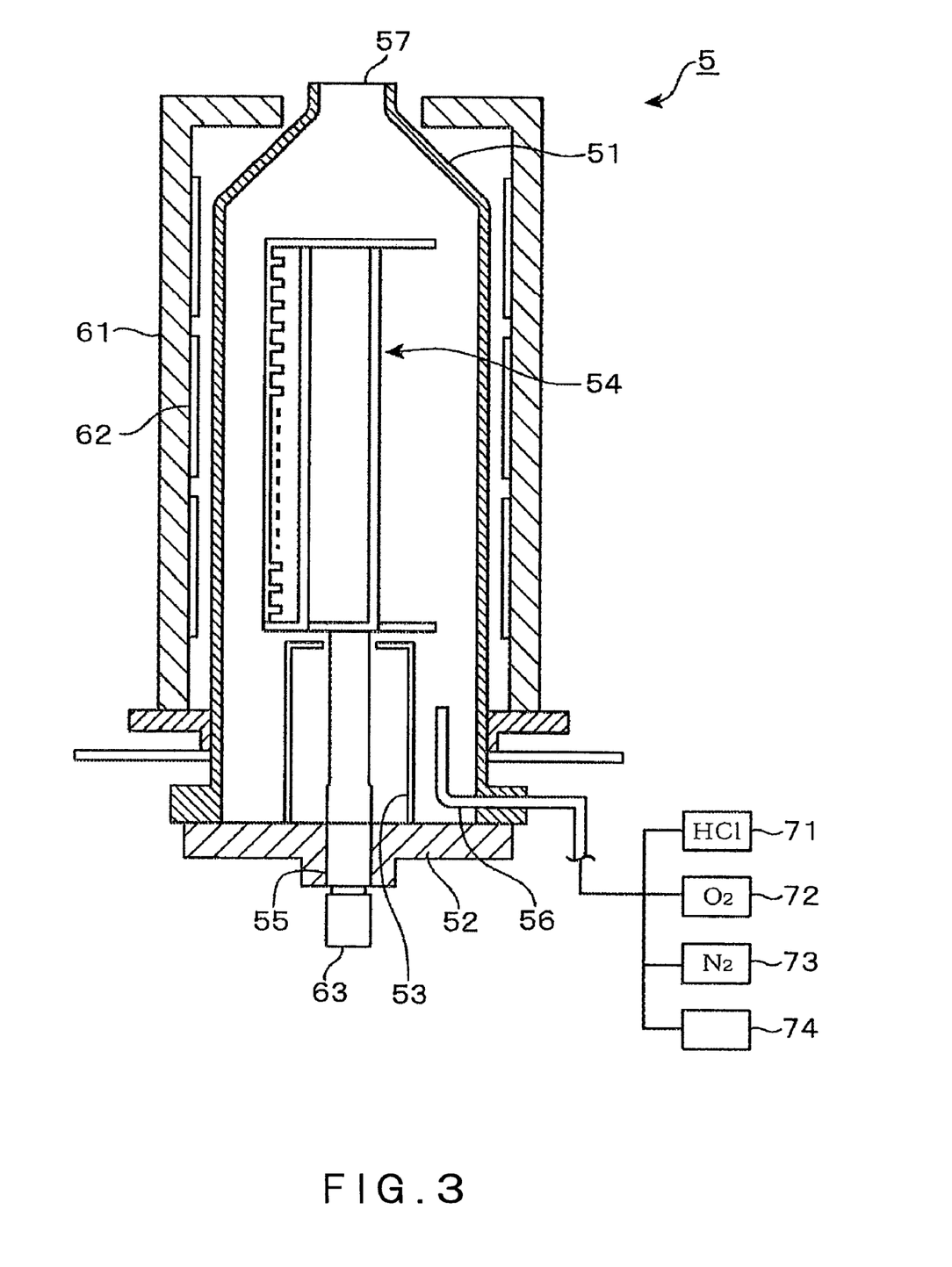
FIG. 3 is a vertically cross-sectioned side view showing a state in which a baking method for obtaining the quartz products according to the present invention is carried out, with the quartz products being incorporated into the vertical-type heat treatment apparatus.

Next, a method for baking the quartz products after they are assembled into a heat treatment apparatus will be described with reference to FIG. 3. A vertical-type heat treatment apparatus 5 shown in FIG. 3 is a well-known structure, and the basic construction of this apparatus 5 is the same as the baking furnace shown in FIG. 1. Reference numeral 51 designates a quartz tube which constitutes a reaction vessel, 52 is a cover, the top face of which is covered with a quartz plate, 53 is a thermal insulation unit, 54 is the wafer boat shown in FIG. 1, 55 is a rotation shaft which can be divided into an upper portion and a lower portion, 56 is an injector which serves as a gas supply pipe, and 57 is an exhaust port, and these components correspond to quartz products which constitute together the vertical-type heat treatment apparatus 5, respectively. In addition, reference numeral 61 represents a housing, 62 is a heater, 63 is a motor adapted to rotate the wafer boat 54. On the side of the proximal end of the injector 56, a hydrogen chloride gas source 71, an oxygen gas source 72, a nitrogen gas source 73, and a processing gas source 74 (usually, comprising a plurality of gas sources, however, for convenience, represented as a gathered body) containing gases used for the heat treatment.

After they are incorporated into the vertical-type heat treatment apparatus 5 and before the apparatus 5 is operated for the first heat treatment for wafers, the quartz products are subject to the baking process as previously described. Namely, the wafer boat 54 is carried in the quartz tube 51 without wafers loaded in the wafer boat 54, and the baking process is conducted by utilizing functions provided to the apparatus 5, such as those of heating, discharging, and supplying gases, so as to obtain quartz products from which copper is removed in the same manner as described above. While this method may be often implemented by a user of the vertical-type heat treatment apparatus 5, it is of course that an effect similar to the previously described embodiment can be obtained.

EXAMPLES

Next, results obtained by a specific baking method for obtaining the quartz products of the present invention will be described.

A. Preparation of an Object to be Tested and a Testing Method

An object to be tested was prepared by cutting a nail portion of the wafer boat by using a diamond cutter. In this case, the wafer boat was shown in FIG. 2 and delivered from a quartz product maker. Using hydrofluoric acid, the surface of the object was etched up to the 10 μm depth. Thereafter, the object to be tested was placed on a silicon-bear wafer mounted on a quartz jig, and the jig was then carried into the baking furnace shown in FIG. 1. In the baking furnace, the baking process according to the method of the present invention had been carried out in advance, and the jig had been previously subjected to the baking process according to the method of present invention in the baking furnace. Therefore, there was no risk that the object to be tested was contaminated with copper due to the baking furnace and the jig. The reaction vessel 2, which was the quartz tube in the baking furnace, was sized larger than the quartz tube of the vertical-type heat treatment apparatus, which could receive 75 sheets, as a maximum, of 12-inch wafers therein. In order to enhance reliability of data, three samples were used as the objects to be tested for each one of the processing conditions. Namely, three objects to be tested were placed on the jig, and then carried into the baking furnace, so as to carry out the baking process under each baking condition.

B. Baking Conditions

The baking conditions (the baking temperature, flow rate of each baking gas and baking time) employed for each object (each one in every set comprising three objects) are listed in Table 1. Baking Condition 1 expresses an object to be tested which was not subjected to the baking process, namely a reference object. Baking Conditions 4, 7, 10 to 12, 14 to 18 were missing in this test. As the baking gases, the oxygen gas and the hydrogen chloride gas were used, and as the pressure in the reaction vessel upon baking, $86.45 \times 10^3$ Pa (650 Torr) was used in Baking Condition 8, while the atmospheric pressure was employed in the other cases.

TABLE 1

| Conditions | Temperature (° C.) | $O_2$ (slm) | HCl (slm) | Baking Time (Hours) | Note |
| --- | --- | --- | --- | --- | --- |
| 1 | — | — | — | — | No Baking |
| 2 | 950 | 10 | 0.6 | 3 | — |
| 3 | 950 | 10 | 0.6 | 7 | — |

TABLE 1-continued

| Conditions | Temperature (° C.) | $O_2$ (slm) | HCl (slm) | Baking Time (Hours) | Note |
| --- | --- | --- | --- | --- | --- |
| 5 | 950 | 10 | 1 | 3 | — |
| 6 | 1000 | 10 | 0.6 | 3 | — |
| 8 | 950 | 10 | 1 | 3 | 650 Torr |
| 9 | 800 | 10 | 1 | 3 | — |
| 13 | 800 | 10 | 0.25 | 3 | — |
| 19 | 900 | 10 | 2 | 10 | — |
| 20 | 900 | 10 | 2 | 20 | — |
| 21 | 900 | 10 | 3 | 10 | — |

C. Method of Quantitative Analysis for Copper Contained in the Object to be Tested Fourteen vessels each containing 10% by weight of hydrofluoric acid were prepared, and a set of three objects to be tested were dipped in a first one of these vessels. The objects were shifted into a second vessel when 1 μm etching was completed. Thereafter, when further 1 μm etching was completed, the objects were shifted into a third vessel, and the shifting was repeated, in succession, up to an eleventh vessel, in this manner. After the objects to be tested were shifted into the eleventh vessel, they were shifted into a twelfth vessel once they were subjected to further 9 μm etching. Subsequently, the objects to be tested were shifted into a thirteenth vessel when once were subjected to further 1 μm etching therein. After these objects to be tested were shifted into the thirteenth vessel, they were shifted into a fourteenth vessel once they were subjected to further 9 μm etching. Thereafter, the objects to be tested were removed from the fourteenth vessel once they were subjected to further 1 μm etching therein. The control of the etching amount was conducted by grasping the relationship between the etching amount and the etching time in advance.

Accordingly, in the hydrofluoric acid contained in the first to tenth vessels, copper contained in the portions, each corresponding to 0 to 1 μm, 1 to 2 μm, 2 to 3 μm, 3 to 4 μm, 4 to 5 μm, 5 to 6 μm, 6 to 7 μm, 7 to 8 μm, 8 to 9 μm and 9 to 10 μm, from the surface of each object to be tested, is dissolved, respectively. In the hydrofluoric acid contained in the twelfth and the fourteenth vessels, copper contained in the portions, each corresponding to 19 to 20 μm and 29 to 30 μm, from the surface of each object to be tested, is dissolved, respectively. The so-obtained hydrofluoric acid contained in the first to tenth vessels and in the twelfth and fourteenth vessels was condensed, and collected with acid after it was dried and solidified by heat evaporation, respectively, so as to obtain the amount of copper by the analysis of ICP-MS. Thereafter, based on the amount of the objects lost by the etching (the total of the etching amounts of the three objects to be tested) and the amount of copper, the copper concentration was calculated for each site in the depth direction from the surface. The detection limit of this case for the copper concentration was 3 ppb. Such an experiment was conducted for each set (each set of the objects baked under each condition) so as to obtain a profile, for each set, showing the relationship between the depth from the surface and the copper concentration.

D. Results of Analysis (Copper Concentration Profile in the Depth Direction)

Figure 4:
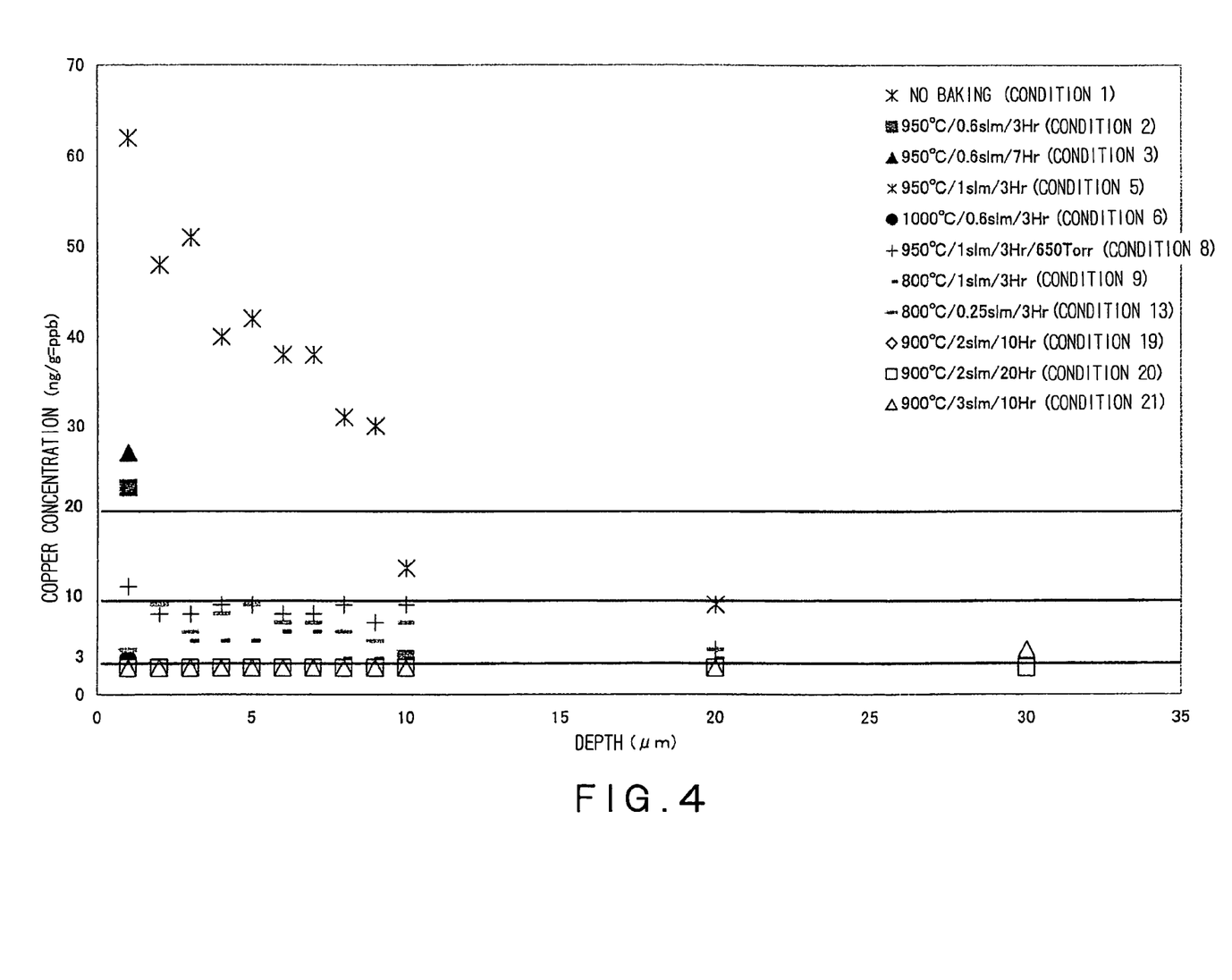
FIG. 4 is a graph showing a copper concentration profile in the depth direction of an object to be tested, which is formed from quartz.
Figure 5:
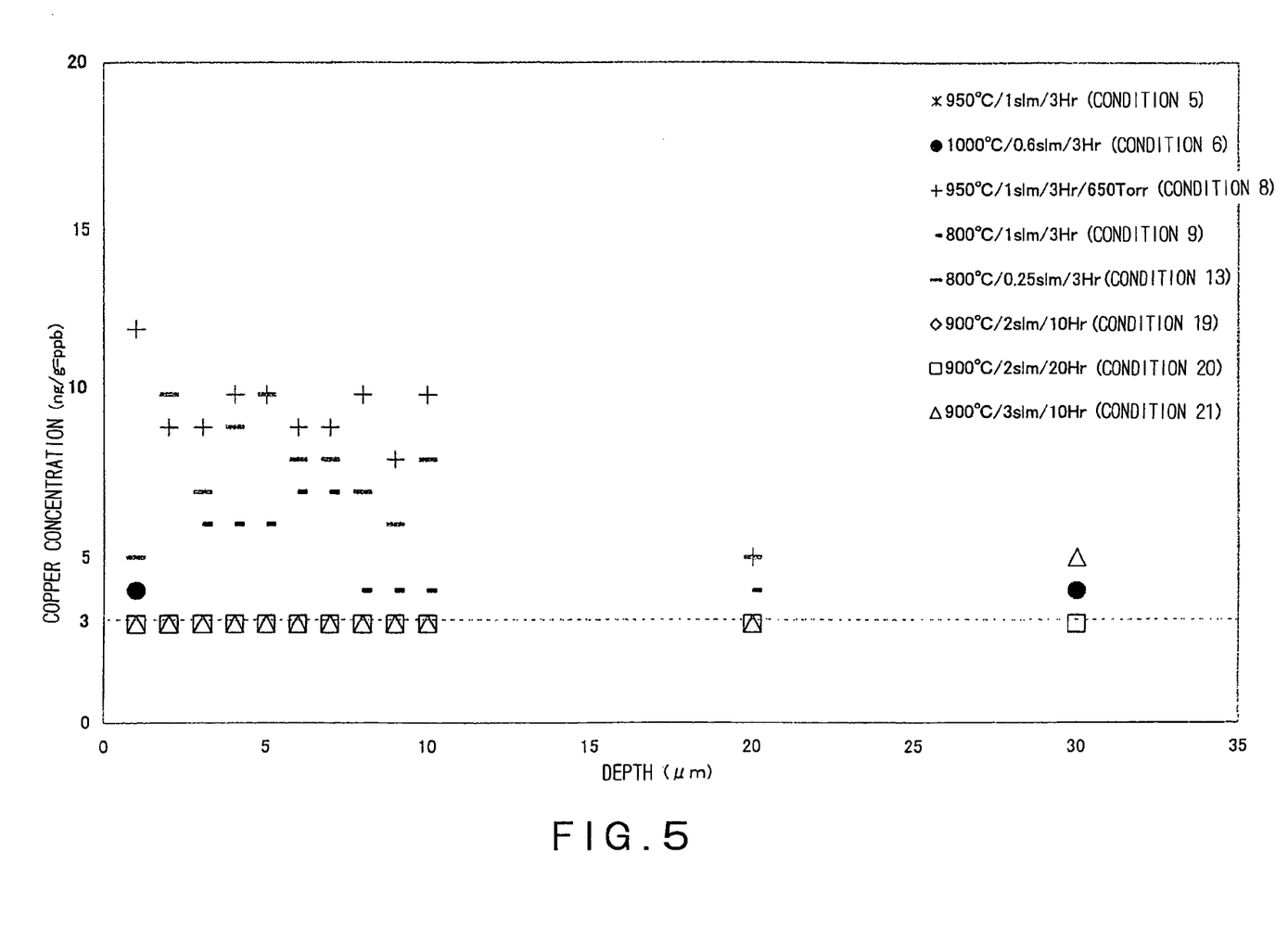
FIG. 5 is a graph showing a copper concentration profile in the depth direction of an object to be tested, which is formed from quartz.

For convenience, each set of the objects baked under each condition is hereinafter called "each condition". The copper concentration profile for each condition in the depth direction is shown in FIGS. 4 and 5. One scale of the copper concentration on the vertical axis designates 10 ppb in FIG. 4, while 5 ppb in FIG. 5. In FIGS. 4 and 5, the copper concentration for each condition is plotted in a total of 12 points, i.e., 10 points from 1 to 10 μm and 2 points at 20 μm and 30 μm, of the depth. The plots corresponding to conditions 2 and 3 at the 1 μm depth do not overlap with other plots corresponding to other conditions (see FIG. 4). On the other hand, such overlapping of plots for each condition can be seen at the points of the copper concentration lower than 5 ppb. In addition, while some plots overlap with each other in a range from 3 μm to 5 μm in FIG. 4, no overlapping is shown in FIG. 5. Furthermore, in FIG. 5, the condition 6 at the 1 μm depth and conditions 6, 21 at the 30 μm depth have no overlapping with other plots for other conditions. In each point where the copper concentration is lower than the detection limit, the plot for each condition overlaps with each other. Accordingly, in the position of the 30 μm depth, all of the conditions except for the condition 6 and condition 21 exhibit the copper concentration below the detection limit. It is noted that the condition 1 is not shown in FIG. 5.

E. Examination

While each object to be tested was etched to the 10 μm depth by hydrofluoric acid before the baking, as is seen from the condition 1, i.e., the reference condition, the copper concentration in the virtual surface (the range of 0 to 1 μm depth) is 62 ppb. This backs up the fact that even though the surface contaminated with copper on the manufacturing stage of the quartz product is wet-etched by hydrofluoric acid, the copper concentration in the virtual surface can not be reduced adequately, and that the copper penetrating into approximately the 30 μm depth can not be removed. This can be attributed to reattachment of copper to the surface of the quartz product as previously described. On the other hand, from the results of experiment above, it can be seen that copper present in a portion from the surface to the 30 μm depth of the object to be tested can be removed by baking the quartz product. It should be noted that there are differences in the copper concentration profile, depending on the conditions, even if the baking is performed.

With respect to the depth up to 30 μm, while the copper concentration in the surface exceeds 20 ppb under the conditions 2 and 3, it is lower than 20 ppb under the other conditions. While the copper concentration under the conditions 5, 19 and 20 can be controlled below 3 ppb, it exceeds 3 ppb, depending on the depth, under the other conditions. In FIGS. 4 and 5, the plots in positions slightly lower than the 3 ppb line represents the concentration lower than the detection limit. From the above results, it can be seen that copper penetrates into the interior of the quartz products on the manufacturing stage of the quartz products, and that the copper concentration profile in the depth direction varies with the baking conditions, and that the copper concentration of each site in the depth region up to 30 μm can be reduced below 20 ppb by the baking process, and that quartz products can be obtained, which are clean and substantially free of copper contamination, i.e., which has a quite low copper concentration, i.e., below 3 ppb, due to further adjustment of the baking conditions.

In this manner, by reducing the copper concentration of each portion below 20 ppb in the depth region up to 30 μm, copper contamination to semiconductor substrates can be suppressed in the vertical-type heat treatment apparatus which is assembled with the quartz products as described above. In addition, by reducing the copper concentration of each site below 3 ppb in the depth region up to 30 μm, it can be realized that the copper concentration has approximately the same level as that in its quartz raw material before the quartz product is machined. Accordingly, the quartz product, which is substantially free of copper contamination, can be obtained. Therefore, copper contamination to semiconductor substrates that is cased by the heat treatment apparatus can be completely eliminated, thus contributing to enhancement of the yield. In particular, in the process where a reducing gas is used in the vertical-type heat treatment apparatus, for example, the process where an ammonia or hydrogen gas is used, the detachment amount of copper becomes larger if the quartz products are contaminated with copper. Therefore, the quartz products prepared in accordance with the present invention can be used effectively in such a case.

With respect to the depth up to 10 μm, while the copper concentration can be suppressed below 3 ppb under the conditions 5, 19, 20 and 21, it exceeds 3 ppb under the other conditions. From the above results, it can be seen that the copper concentration of each portion in the depth region up to 10 μm can be reduced below 3 ppb by adjusting the baking conditions, and that the copper contamination of semiconductor substrates can be suppressed in the vertical-type heat treatment apparatus which is assembled with the quartz products prepared in accordance with the present invention, thus enhancing the yield. Meanwhile, in the process where a non-reducing gas is used, such as oxygen or nitrogen, in the vertical-type heat treatment apparatus, since the detaching amount of copper is smaller than the case of using the reducing gas, reduction of the copper concentration in the depth region up to 10 μm below 3 ppb can satisfy sufficient suppression of the copper contamination to semiconductor substrates.

F. Others

Figure 6:
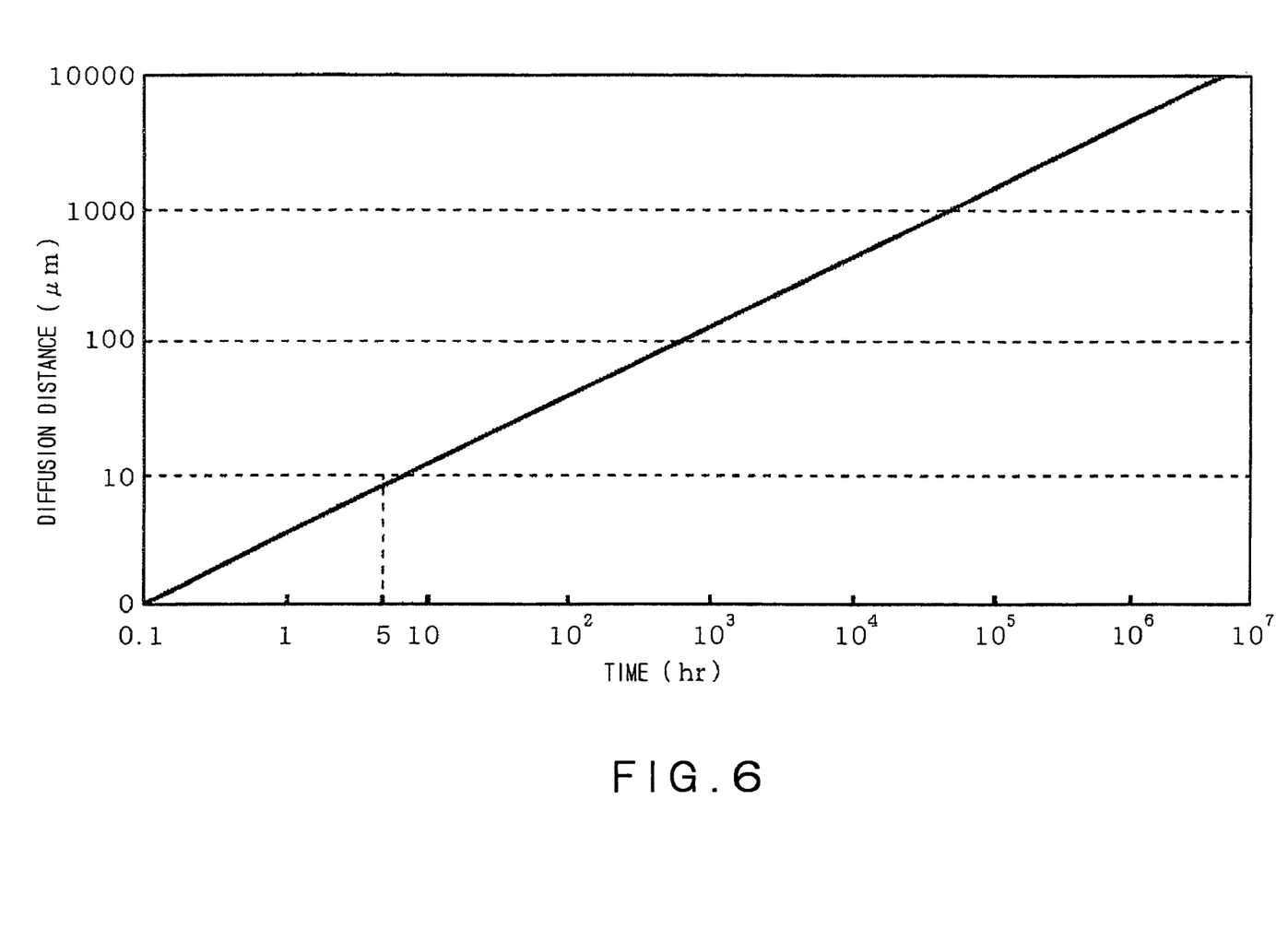
FIG. 6 is a graph showing a relationship between the diffusion distance of copper in quartz and the time the object is placed in an atmosphere.

FIG. 6 is a graph showing the diffusion amount of copper in quartz obtained in a nitrogen gas atmosphere at 1000° C. under an ordinary pressure, wherein the horizontal axis represents the time and the vertical axis represents the diffusion distance. Since the diffusion coefficient D of copper in quartz at 1000° C. is $10^{-11}$ cm$^2$/sec, if the time is designated by t, the diffusion distance can be obtained as the following equation, and this graph is made based on the equation.

$$\text{The diffusion distance} = 2 \times (D \cdot t)^{1/2}.$$

As shown in FIG. 6, the diffusion distance at 5 hours is slightly smaller than 10 μm. The maximum time for the heat treatment in the heat treatment apparatus including the quartz products is usually within 5 hours, and the processing temperature in the CVD apparatus is 700 degrees at the most. Therefore, in the case of using the CVD apparatus as the heat treatment apparatus, by controlling the copper concentration in the region from the surface up to the 10 μm depth of the quarts product, the copper contamination to wafers due to scattering of copper from the quartz products can be prevented.

Namely, when the CVD process is performed to wafers, while thin films are deposited also on the surfaces of the quartz tube and the wafer boat, copper is likely to be diffused. Accordingly, in a first operation carried out after assembling of the CVD apparatus, the thin film deposited on the quartz products is still thin. Therefore, if copper penetrating into the interior from the surface of each quartz product is diffused toward the surface, it is likely that the cupper scatters into the processing atmosphere after passing through the thin film. Thus, the control for the copper concentration as described above is required for the quartz products. In the case where the process to be performed in the heat treatment apparatus includes oxidation and/or diffusion, there is no film to be deposited on the quartz products. Accordingly, since the surface of the quartz is directly contacted with wafers, it is necessary to control the copper concentration in the region from the surface to the 30 μm depth of each quartz product.

The invention claimed is:

1. A baking method of a quartz product, which is placed in a reaction vessel containing semiconductor substrates and providing a heat treatment thereto, and at least a portion of which is located in a heating atmosphere in the reaction vessel, the baking method comprising the steps of:
   placing the quartz product before being subjected to the heat treatment, in the reaction vessel;
   supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 30 μm depth of the quartz product can be controlled below 20 ppb; and
   then stopping the supply of the hydrogen chloride gas while continuing the supply only of the oxygen gas to prevent impurities from being formed on the quartz product.

2. The baking method according to claim 1, wherein the copper concentration in the region from the surface to the 30 μm depth is below 3 ppb.

3. The baking method according to claim 1,
   wherein the quartz product includes a portion which is directly contacted with semiconductor substrates, and
   wherein in the portion which is directly contacted with semiconductor substrates, the copper concentration in the region from the surface to the 1 μm depth is below 10 ppb.

4. A baking method of a quartz product, which is placed in a reaction vessel containing semiconductor substrates and providing a heat treatment thereto, and at least a portion of which is located in a heating atmosphere in the reaction vessel, the baking method comprising the steps of:
   placing the quartz product before being subjected to the heat treatment, in the reaction vessel;
   supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 10 μm depth of the quartz product can be controlled below 10 ppb; and
   then stopping the supply of the hydrogen chloride gas while continuing the supply only of the oxygen gas to prevent impurities from being formed on the quartz product.

5. The baking method according to claim 4, wherein the copper concentration in the region from the surface to the 10 μm depth is below 3 ppb.

6. The baking method according to claim 1 or 4, wherein the quartz product is incorporated as a part of the heat treatment apparatus by providing the quartz product in the reaction vessel.

7. The baking method according to claim 1 or 4, wherein the reaction vessel is heated at the temperature within the range of from 800 to 1000° C.

8. A computer program for making a computer implement a baking method of a quartz product, which is placed in a reaction vessel containing semiconductor substrates and providing a heat treatment thereto, and at least a portion of which is located in a heating atmosphere in the reaction vessel, the baking method comprising the steps of:
   placing the quartz product before being subjected to the heat treatment, in the reaction vessel;
   supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 30 μm depth of the quartz product can be controlled below 20 ppb; and
   then stopping the supply of the hydrogen chloride gas while continuing the supply only of the oxygen gas to prevent impurities from being formed on the quartz product.

9. A computer program for making a computer implement a baking method of a quartz product, which is placed in a reaction vessel containing semiconductor substrates and providing a heat treatment thereto, and at least a portion of which is located in a heating atmosphere in the reaction vessel, the baking method comprising the steps of:
   placing the quartz product before being subjected to the heat treatment, in the reaction vessel;
   supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 10 μm depth of the quartz product can be controlled below 10 ppb; and
   then stopping the supply of the hydrogen chloride gas while continuing the supply only of the oxygen gas to prevent impurities from being formed on the quartz product.

10. A storage medium for storing a computer program for making a computer implement a baking method of a quartz product, which is placed in a reaction vessel containing semiconductor substrates and providing a heat treatment thereto, and at least a portion of which is located in a heating atmosphere in the reaction vessel, the baking method comprising the steps of:
    placing the quartz product before being subjected to the heat treatment, in the reaction vessel;
    supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 30 μm depth of the quartz product can be controlled below 20 ppb; and
    then stopping the supply of the hydrogen chloride gas while continuing the supply only of the oxygen gas to prevent impurities from being formed on the quartz product.

11. A storage medium for storing a computer program for making a computer implement a baking method of a quartz product, which is placed in a reaction vessel containing semiconductor substrates and providing a heat treatment thereto, and at least a portion of which is located in a heating atmosphere in the reaction vessel, the baking method comprising the steps of:

placing the quartz product before being subjected to the heat treatment, in the reaction vessel;

supplying baking gases, including a hydrogen chloride gas and an oxygen gas for enhancing reactivity of the hydrogen chloride gas, into the reaction vessel, while heating the reaction vessel, for removing copper as a contaminant incorporated during the manufacturing process of the quartz product, whereby the copper concentration in the region from a surface to a 10 μm depth of the quartz product can be controlled below 10 ppb; and then stopping the supply of the hydrogen chloride gas while continuing the supply only of the oxygen gas to prevent impurities from being formed on the quartz product.

* * * * *